United States Patent
Jin et al.

(10) Patent No.: US 10,998,756 B2
(45) Date of Patent: May 4, 2021

(54) MICROGRID SYSTEM AND METHOD FOR MANAGING MALFUNCTION

(71) Applicant: HYOSUNG HEAVY INDUSTRIES CORPORATION, Seoul (KR)

(72) Inventors: Dae Geun Jin, Incheon (KR); Bo Gun Jin, Anyang-si (KR)

(73) Assignee: HYOSUNG HEAVY INDUSTRIES CORPORATION, Seoul (KR)

(*) Notice: Subject to any disclaimer, the term of this patent is extended or adjusted under 35 U.S.C. 154(b) by 60 days.

(21) Appl. No.: 16/467,074

(22) PCT Filed: Dec. 5, 2017

(86) PCT No.: PCT/KR2017/014140
§ 371 (c)(1),
(2) Date: Jun. 6, 2019

(87) PCT Pub. No.: WO2018/105989
PCT Pub. Date: Jun. 14, 2018

(65) Prior Publication Data
US 2019/0319481 A1    Oct. 17, 2019

(30) Foreign Application Priority Data

Dec. 9, 2016  (KR) .................. 10-2016-0167910

(51) Int. Cl.
*H02J 9/06*    (2006.01)
*H02H 1/00*    (2006.01)
(Continued)

(52) U.S. Cl.
CPC ............ *H02J 9/06* (2013.01); *H02H 1/0007* (2013.01); *H02H 7/22* (2013.01); *H02J 3/32* (2013.01);
(Continued)

(58) Field of Classification Search
CPC .... H02J 3/381; H02J 13/0017; H02J 2300/10; H02J 2310/10; H02J 3/32; H02J 9/062;
(Continued)

(56) References Cited

U.S. PATENT DOCUMENTS

2004/0070280 A1    4/2004  Nakata et al.
2014/0200722 A1*   7/2014  Bhavaraju ............... H02J 3/381
                                                    700/286
(Continued)

FOREIGN PATENT DOCUMENTS

KR    10-2009-0107411 B1    11/2009
KR       10-1266953 B1       5/2013
(Continued)

OTHER PUBLICATIONS

Lee, Kang-Wan et al., The Stabilization Method Study on isolating operation of Microgrid, Proceedings of The Korean institute of Electrical Engineers (KIEE) Summer Conference, Jul. 2012, pp. 920-921.

*Primary Examiner* — Jared Fureman
*Assistant Examiner* — Duc M Pham
(74) *Attorney, Agent, or Firm* — Novick, Kim & Lee, PLLC; Jae Yoon Kim

(57) ABSTRACT

Provided is a microgrid system having: a plurality of distributed power sources; a plurality of distributed loads; and lines for connecting the distributed power sources and the distributed loads, the microgrid system including: an ESS for storing power supplied from all or a portion of the distributed power sources and supplying the stored power to all or a portion of the distributed loads; an ESS PCS including an interruption means for converting the power stored in the ESS into AC power suitable for the microgrid and supplying the AC power to the microgrid in order to block connection to the microgrid in an abnormal state; and a monitoring/control device for gradually increasing a volt- (Continued)

age output from the ESS PCS and performing processing for the failure when a failure is detected in the microgrid.

9 Claims, 10 Drawing Sheets

(51) Int. Cl.
*H02H 7/22* (2006.01)
*H02J 3/32* (2006.01)
*H02J 3/38* (2006.01)
*H02J 13/00* (2006.01)
*H02J 3/00* (2006.01)

(52) U.S. Cl.
CPC .......... *H02J 3/382* (2013.01); *H02J 13/0017* (2013.01); *H02J 3/001* (2020.01)

(58) Field of Classification Search
CPC ... H02J 2300/20; G01R 31/08; H02H 1/0007; H02H 7/26
See application file for complete search history.

(56) References Cited

U.S. PATENT DOCUMENTS

2016/0190822 A1\* 6/2016 Lee ........................... H02J 3/32
                                                                      307/24
2019/0123662 A1\* 4/2019 Zhang ..................... H02J 3/381

FOREIGN PATENT DOCUMENTS

| KR | 10-2013-0098175 B1 | 8/2013 | |
|----|---|---|---|
| KR | 10-2013-0115632 A | 10/2013 | |
| KR | 10-2013-0131109 A | 12/2013 | |
| KR | 10-2015-0035277 A | 4/2015 | |
| KR | 10-1514999 B1 | 4/2015 | |
| KR | 20150035277 | \* 4/2015 | ............... H02H 7/22 |

\* cited by examiner

MICROGRID SYSTEM AND METHOD FOR MANAGING MALFUNCTION

TECHNICAL FIELD

The present invention relates to a microgrid system for performing failure management and a failure management method using the same, and more particularly, to a system and a method capable of shortening a power failure time with respect to a non-failure section in which unnecessary power failure is experienced when a failure occurs in a grid.

BACKGROUND ART

A microgrid is a small-scale power source system configured with distributed power sources (solar power plant, wind power plant, and the like) and batteries (power storage devices) to supply power to loads. The microgrid is usually operated in a connected operation mode in which power is traded in connecting with a large scale power grid, and when a failure occurs in an electric-power-company-side line, the microgrid can be separated from the power grid to switch to a stand-alone operation mode. The microgrid is mainly installed in buildings, university campuses, factories, or the like and aims to reduce electricity costs and to improve reliability of power source. On the other hand, in the case of a microgrid installed in a remote area such as islands, the microgrid can be operated by constructing one grid with self loads without connecting with an external power grid.

One of the aims of installation of the microgrid is to operate the microgrid in an uninterrupted manner to improve power source reliability. In a case where a failure occurs in the power grid, the failure needs to be accurately detected to quickly separate the microgrid from the power grid. In addition, in a case where a failure occurs in the microgrid, it is necessary to quickly separate only the corresponding section to prevent a power failure. On the other hand, the magnitude and direction of a failure current vary depending on the connecting state of the microgrid and the power grid, connecting state of the microgrid and the distributed power sources, the failure occurrence position, and the type of failure occurrence, or the like. However, existing circuit breakers (MCCB, ACB, and the like) and failure management methods cannot adequately cope with various types of failures occurring in the microgrid, and thus, the entire microgrid can be affected by a localized failure, so that entire power failure may occur. In particular, this leads to frequent inconvenience to the microgrid systems installed in a remote area such as islands having a stand-alone grid.

FIG. 11 illustrates a non-failure-section power source system using a distributed power source 40 in the related art. Referring to FIG. 11, the non-failure-section power source system using the distributed power source 40 includes an IED 100 for power distribution automation, an IED 200 for distributed power source, and a central management device 300.

The IED 100 for power distribution automation measures the voltage and current of the power distribution line, and when a failure occurs in the power distribution grid, the event of the failure of the line is transmitted to the central management device 300, so that an operator of the power distribution automation system can be allowed to analyze the failure.

When a temporary failure occurs, the IED 100 for power distribution automation determines based on the failure current whether or not there is a failure in the power distribution grid or determines the direction of the failure current. In a case where it is determined that there is a failure, the IED 100 transmits FI (fault indicator) information to the central management device 300.

In a case where a temporary failure occurs, the central management device 300 determines a failure section from the failure information provided from the IEDs 100 for power distribution automation and transmits an operation command of the switch 30 to the IED 100 for power distribution automation. The IED 100 for power distribution automation performs the control of the switch 30 and, after that, transmits the result of the control to the central management device 300 to perform the failure management procedure.

That is, the IED 100 for power distribution automation measures an overcurrent of the power distribution line, blocks the line through a protection device 20 of a circuit breaker or a recloser. When the load stage of the protection device 20 is in a non-voltage state, the failure of the power distribution line is detected through the switch. In addition, the central management device 300 controls the closing and opening of the switch based on a control signal of the central management device 300 to perform a function of controlling the failure section to be separated from the power distribution grid.

In a case where a failure occurs in the power distribution line, the IED 100 for power distribution automation transmits failure occurrence information to the IED 200 for the distributed power source, so that the IED 200 for the distributed power source can be allowed to supply power to the non-failure section through the distributed power source 40.

Furthermore, the IED 100 for power distribution automation performs a function of measuring an average load current with respect to the load stage existing between the distributed power source 40 and the IED 100 for power distribution automation. The average load current can be calculated by measuring the load current with respect to the load stage for a predetermined period of time. The average power consumption consumed by the load stage each time of day can be calculated. The information calculated by the IED 100 for power distribution automation is transmitted to the IED 200 for distributed power source and can be utilized as data for calculating the amount of power to be supplied through the distributed power source 40 when a failure occurs in the power distribution grid.

The IED 200 for distributed power source is connected to a distributed power source 40 and calculates the amount of power that the distributed power source 40 can supply to the grid when there is a failure in the power distribution grid. The IED 200 for distributed power source can calculate the amount of power based on the power generation amount of the distributed power source 40 and the battery storage amount.

The IED 200 for distributed power source is connected to the IED 100 for power distribution automation in a peer to peer manner to check the amount of power consumed in the power distribution line connected to the distributed power source 40 and receives the failure occurrence information from the IED 100 for power distribution automation.

Furthermore, when the failure occurrence information and the failure current information are received from the IED 100 for power distribution automation, a non-failure section in which a power failure is unnecessarily experienced due to the failure is identified, so that power can be supplied to the non-failure section by controlling the switch between the distributed power source 40 and the grid.

The IED 200 for distributed power source analyzes the information on the failure occurrence and the information on the failure current included in the failure information to identify the failure section or to identify the failure occurrence section through the identification information of the IED 100 for power distribution automation for transmitting the failure information.

The central management device 300 monitors the entire system and analyzes the received failure information of the power distribution grid from the IED 100 for power distribution automation to perform a function of controlling the closing and opening of the switch 30. When receiving the failure information from the IED 100 for power distribution automation, the central management device 300 analyzes the failure information and transmits a signal of controlling the closing and opening of the switch 30 to the IED 100 for power distribution automation, so that the failed line can be allowed to be separated from the grid.

However, the microgrid system illustrated in FIG. 11 has an IED for each distributed power source and distributed load (power distribution). Each IED requires a relatively large test power to accurately identify a failure when the failure occurs. In the case of the related art, for the test power, each IED needs to have a relatively large capacity of energy storage device or a diesel generator for production of the test power, which inevitably causes an increase in equipment costs.

SUMMARY OF INVENTION

Technical Problem

The present invention is to provide a microgrid or a failure management method that can quickly identify and manage a failure position. More specifically, the present invention is to provide a method of identifying a position of a failure using an ESS, separating the failure point, and reconstructing power transmission when the failure occurs in a line or a device in off-grid.

The present invention is to improve reliability by performing a stable grid operation in a microgrid. In order to do this, an SS PCS is allowed to quickly identify the failure point and separate the failure point.

Solution to Problem

According to an aspect of the present invention, there is provided a microgrid system having a plurality of distributed power sources; a plurality of distributed loads; and lines for connecting the distributed power sources and the distributed loads, the microgrid system including: an ESS for storing power supplied from all or a portion of the distributed power sources and supplying the stored power to all or a portion of the distributed loads; an ESS PCS including an interruption means for converting the power stored in the ESS into AC power suitable for the microgrid and supplying the AC power to the microgrid in order to block connection to the microgrid in an abnormal state; and a monitoring/control device for gradually increasing a voltage output from the ESS PCS and performing processing for the failure when a failure is detected in the microgrid.

In the above aspect, the monitoring/control device may perform steps of: blocking the distributed power source and the ESS when a failure is detected in the microgrid; connecting the ESS PCS to the microgrid; gradually increasing the voltage output from the connected ESS PCS and determining a position where the failure occurred; and blocking the position where the failure occurred and connecting the distributed power source to the microgrid.

In the above aspect, the interruption means may include: a DC-stage switch for interrupting a battery and an inverter of the ESS; an AC-stage switch for interrupting the inverter of the ESS PCS and the microgrid; and an IGBT interruption means for interrupting an IGBT constituting the inverter.

In the above aspect, an open time of an IGBT constituting an inverter of the ESS PCS may be within 400 [μs], and a time for gradually increasing the voltage output from the ESS PCS may be a period of time specified in a range of 1 second to 3 seconds.

In the above aspect, the monitoring/control device may include a communication means capable of communicating data with a detection/measurement means installed in the distributed power sources, the distributed loads, and the lines.

In the above aspect, the monitoring/control device may gradually increase the current from 0 [A] to a level of 80% of a rated current that can be output to the microgrid for a specified period of time in order to gradually increase the voltage output from the ESS PCS.

According to another aspect of the present invention, there is provided a failure management method for a microgrid system having: a plurality of distributed power sources; a plurality of distributed loads; lines for connecting the distributed power sources and the distributed loads; and an ESS for storing power supplied from all or a portion of the distributed power sources and supplying the stored power to all or a portion of the distributed loads, the failure management method including steps of: blocking the distributed power source and the ESS when a failure is detected in the microgrid system; connecting a PCS of the ESS to the microgrid; gradually increasing a voltage output in the PCS of the ESS and determining a position where the failure occurred; and blocking the position where the failure occurred and connecting the distributed power source to the microgrid.

In the above aspect, the step of connecting the PCS of the ESS to the microgrid may include steps of: closing a DC-stage switch for interrupting a battery and an inverter of the ESS; closing an AC-stage switch for interrupting the inverter of the ESS and the microgrid; and closing the IGBT constituting the inverter.

In the above aspect, in the step of determining the position where the failure has occurred, a trend of current change with the gradual increase of the voltage may be compared with a trend of current change in a normal state, and if there is checked an increasing trend in which the trend of current change is significantly higher than the trend of current change in the normal state, it may be determined that there is a failure in a line/load side.

In the above aspect, in the step of determining the position where the failure has occurred, the current may be gradually increased from 0 [A] to a level of 80% of a rated current that can be output to the microgrid for a specified period of time in order to gradually increase the voltage output from the ESS PCS.

Advantageous Effects of Invention

When a microgrid system or a failure management method according to the present invention having the above-described configuration is performed, there is an advantage of performing stable grid operation due to fast removal of a failure section and improving reliability of the microgrid system.

In addition, the microgrid system according to the present invention has an advantage in that it is not necessary to install a separate diesel generator or to provide a large capacity battery for each distributed power source for a failure test.

In addition, the microgrid system according to the present invention has an advantage of minimizing a power generation amount of a new renewable source discarded by a power failure.

In addition, the microgrid system according to the present invention has an advantage of being easily maintained and managed in a microsystem of a remote area such as islands constituting a stand-alone grid without connection to independent external power systems and being suitable for long current supply application.

DESCRIPTION OF EMBODIMENTS

Figure 1:
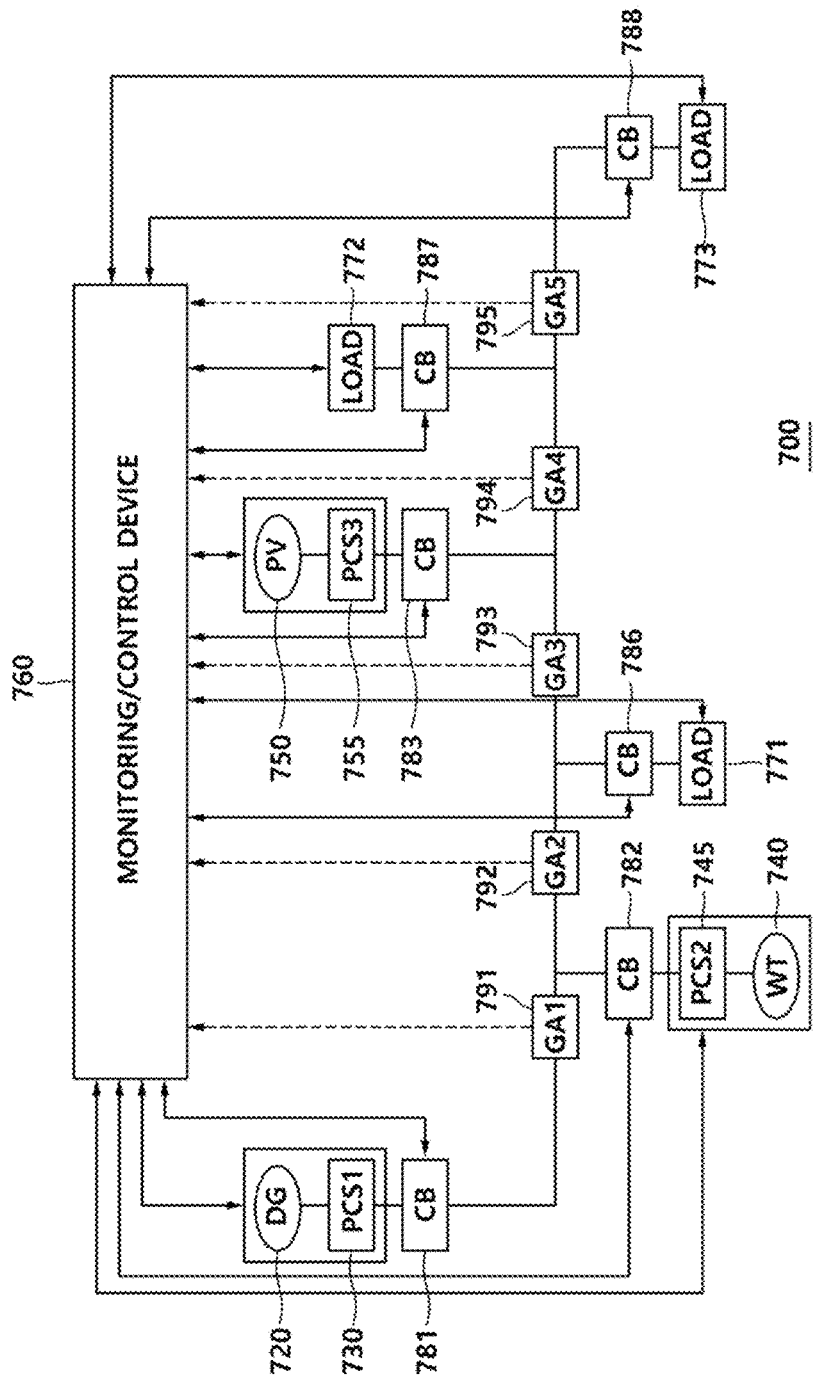
FIG. 1 is a block diagram illustrating a microgrid system according to the present invention.

Hereinafter, embodiments of the present invention will be described with reference to the accompanying drawings.

In describing the invention, the terms first, second, and the like may be used to describe various components, but the components may not be limited by the terms. The terms are used only for the purpose of distinguishing one component from the others. For example, without departing from the scope of the present invention, a first component may be referred to as a second component, and similarly, a second component may also be referred to as a first component.

In a case where a component is referred to as being connected to or coupled with another component, the component may be directly connected to or coupled with another component, but it may be understood that still another component may exist between the components.

The terms used herein are used for the purpose of describing particular embodiments only and are not intended to limit the invention. The singular expressions may include plural expressions unless the context clearly denotes otherwise.

It is to be understood that, in the present specification, the terms "comprising", "including", and the like are intended to specify the presence of features, numbers, steps, operations, elements, components, or combinations thereof described in the specification, but the terms do not preclude the presence or addition of one or more other features, numbers, steps, operations, elements, components, or combinations thereof.

In addition, shapes and sizes the elements in the drawings may be exaggerated for clarity.

FIG. 1 is a block diagram illustrating a microgrid system 700 according to the present invention.

The illustrated microgrid system 700 includes: a plurality of distributed power sources 740 and 750 supplying power to a grid; a plurality of distributed loads 771, 772, and 773 consuming the power in the grid; lines for connecting the distributed power sources 740 and 750 and the distributed loads 771, 772, and 773 to the grid; and an ESS 720 storing the power from all or a portion of the distributed power sources 740 and 750 and supplying the stored power to all or a portion of the distributed loads 771, 772, and 773.

The microgrid system 700 may include interruption means 781 to 788 capable of selectively connecting or blocking each of all or a portion of the plurality of distributed power sources 740 and 750 and the distributed loads 771 772 and 773 to the grid.

The lines need to have ideally identical electrical characteristics (potentials) for the distributed power sources 740 and 750 and the distributed loads 771, 772, and 773 connected to the grid. However, the respective points of the lines have different electrical characteristics (potentials, currents) due to the unbalance of the supplied power and/or the load and the impedance of the long lines.

In order to monitor the different electrical characteristics, detection/measurement means 781 to 785 (for example, an ampere meter, a voltmeter, a current flow meter, or a Hall sensor) may be provided at specific points of the lines.

For example, the detection/measurement means may be provided at each connection point of the distributed power sources 740 and 750 and the distributed loads 771, 772, and 773, or the detection/measurement means may be provided in units of a predetermined length.

According to the implementation, each of all or a portion of the plurality of distributed power sources 740 and 750 and the distributed loads 771, 772, and 773 may include a detection/measurement means or a monitoring means for monitoring their own operational states and/or electrical characteristics.

The ESS 720 has a configuration for reducing the power burden due to uneven load demands in the microgrid. Recently, for the ESS 720, a method using a lithium secondary battery has been used, but a known energy storage means may be applied.

The plurality of distributed power sources 740 and 750 also include respective PCSs 745 and 755, and the plurality of distributed loads 771 and 772 and 773 also include respective interruption means 786 to 788. However, the functions according to the present invention are implemented by using a PCS 730 of the ESS 720 and an interruption means 781 for connecting/blocking the PCS 730 to the grid. The PCS 730 and the interruption means 781 for the ESS 720 will be described more in detail.

The PCS 730 for the ESS 720 may be referred to as an ESS PCS 730 and includes an interruption means 781 which converts the power stored in the ESS 720 into AC (or DC) power suitable for the microgrid to supply the power to the microgrid or to interrupt connection to the microgrid in an abnormal situation such as a power failure or a short circuit.

The ESS PCS 730 can perform a power phase synchronization function for matching the power phase of the grid with the power phase of the power output from the PCS to the grid, a function of adjusting the amount of power (that is, magnitudes of the voltage and/or the current) supplied to the grid, and a surge reduction/protection function for reducing and/or blocking transfer of risk factors such as a surge occurring in the grid side to the ESS 720 and can has a configuration for these functions. Since the above-described functions are known in the ESS field, detailed description thereof is omitted.

In a case where a failure occurs in the microgrid to which the ESS 720 is connected by the above-described configurations for the power phase synchronization function and the surge reduction/protection function of the ESS PCS 730, the ESS PCS 730 may be separated from the grid for a while. In order to protect the ESS PCS 730 during the temporary grid separation process and the failure position determination process according to the present invention, the opening time of an IGBT (more specifically, an IGBT constituting the inverter) included in the ESS PCS 730 is advantageously within about several hundred microseconds (μs).

The ESS PCS 730 according to the present invention that is capable of adjusting the amount of power with a continuous value, if possible, is advantageous in the function of adjusting the amount of power supplied to the grid. Even in a case where the amount of power is adjusted stepwise in a discontinuous manner, the steps that are set to be detailed are advantageous if possible. For example, the illustrated ESS PCS 730 can gradually the current from 0 [A] to a level (if not a failure) of 80% of the maximum current (rated current) that can be output to the grid during a predetermined test time (for example, a period of time specified in a range of 1 second to 3 seconds) at the starting time.

The ESS PCS 730 according to the present invention can adjust the amount of power output to the grid according to the connection state of the plurality of distributed power sources 740 and 750 and the plurality of distributed loads 771, 772, and 773 for the grid in the microgrid system. This can be implemented by applying the ESS technology and/or the PCS technology for configuring a known smart grid system.

The process of gradually increasing the output voltage for a predetermined period of time (for example, a period of time specified in a range of 1 second to 3 seconds) in the above-described ESS PCS can be performed by a method of connecting the ESS, which has been separated from the grid, to the grid again and sequentially increasing the voltage from 0 V at the beginning of the connection to a predetermined voltage level for a predetermined period of time (for example, a period of time specified in a range of 1 second to 3 seconds). In this case, it is most preferable that the relationship between the time and the voltage forms a continuous linear function (a straight line with a predetermined slope). However, in a practical application, as a condition indicating a relationship of a proportional increase between the time and the voltage, the relationship between the time and the voltage may have characteristics of discrete and/or curved lines.

Herein, the reference point of the voltage and current measurement is preferably the output stage (connection point with the grid) of the ESS PCS, but the reference point is not limited thereto.

As described above, as a method of gradually increasing the output voltage for a predetermined period of time in the ESS PCS, a general ESS PCS function in the related art can be used. For example, as an example of the method of gradually increasing the output voltage, in a case where an ESS is configured with a plurality of battery cells, the number of cells used for generating an output power among buffered battery cells can be sequentially increased. Alternatively, in a case where a separate temporary energy storage means such as a supercapacitor is used to supply power stored in an ESS battery to the grid, the output voltage can be adjusting in such a manner that the capacity and/or the number of unit cells of the temporary energy storage means are adjusted. Alternatively, a transformer having a multi-stage tap capable of discretely increasing the output voltage level can be used.

The microgrid system 700 according to the present invention may include a monitoring/control device 760 determining a position where a failure has occurred in the microgrid system by using the ESS PCS 730 and performing black start as a follow-up measures to the failure.

The monitoring/control device 760 is advantageously provided at a centralized control site of the microgrid system 700. In order to actively utilize the ESS 720 and the ESS PCS 730, the monitoring/control device 760 is advantageously located at or close to the same site (place) as the ESS 720.

The monitoring/control device 760 can communicate data (signals) with the detection/measurement means 791 to 795 or the monitoring means provided on the ESS 720, the ESS PCS 730, the distributed power sources 740 and 750, and the distributed loads 771, 772, and 773, and the lines. In order to do this, the monitoring/control device 760 may include a power line communication means capable of accessing each detection/measurement means or monitoring means or a wired/wireless communication means using a separate power line and an independent medium.

Figure 2:
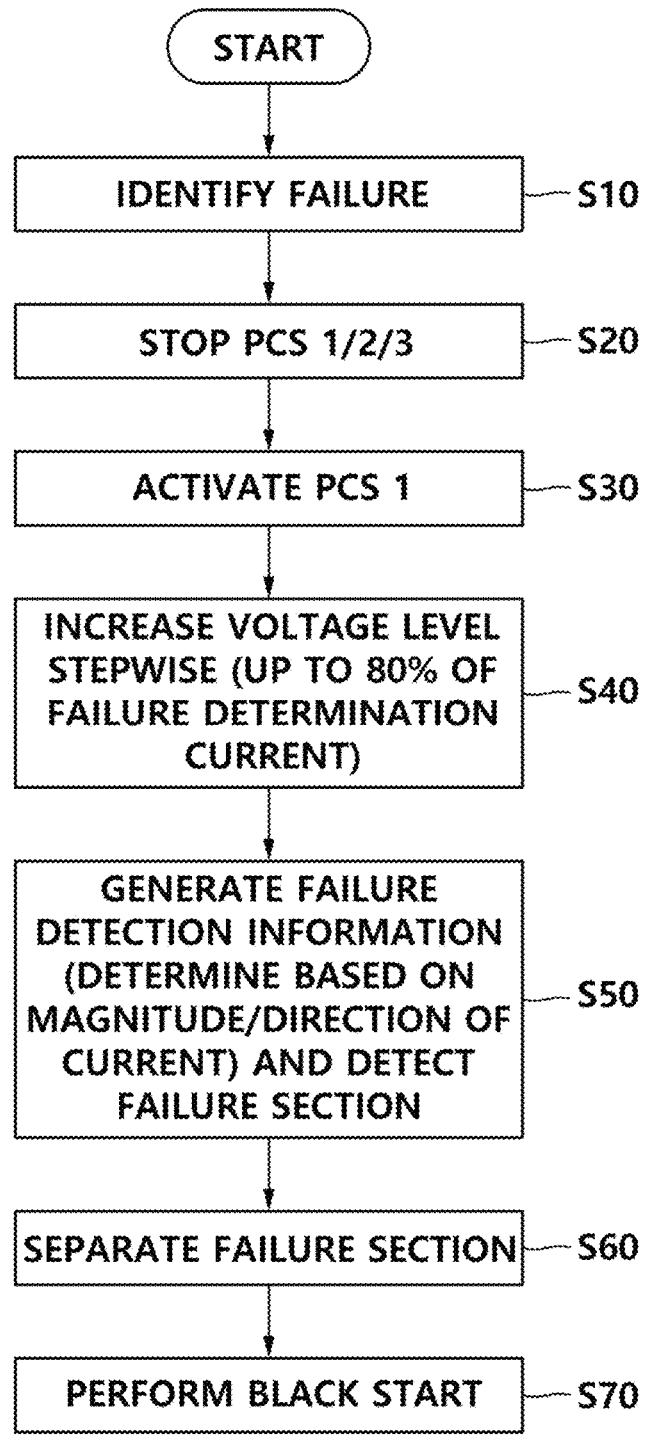
FIG. 2 is a flowchart illustrating a failure management method performed in a monitoring/control device of FIG. 1.

FIG. 2 is a flowchart illustrating a failure management method performed in the monitoring/control device 760 of FIG. 1.

The illustrated failure management method includes: a failure detection step S10 of detecting a failure in the microgrid system; a grid interruption step S20 of blocking the distributed power sources and the ESS; a step S30 of connecting the ESS PCS to the microgrid system; a step S40 of gradually increasing the voltage output from the connected ESS PCS and a step S50 of determining the position where the failure has occurred (S50); and a step S60 of blocking the position where the failure has occurred and a step S70 of connecting the distributed power sources to the microgrid.

The failure detection step S10 may be performed in the PCS s of the distributed power sources and the ESS connected to the microgrid. That is, each PCS can detect the failure occurring in the microgrid system by a self-protection function to protect the distributed power source or the ESS that mediates with the grid. The PCS that has detected the failure can report the failure to the monitoring/control device by using a data communication means.

In a case where the PCS detects the failure, the grid interruption step S20 can be performed by a function of the PCS. In a case where the PCS cannot detect the failure, the grid interruption step S20 can be performed by an interrupt command of the monitoring/control device that has received the failure report.

In the figure, it is illustrated that only the PCS s connected to the grid is blocked in the grid interruption step S20. However, another implementation, the distributed loads and the distributed power sources having no PCS can also be blocked from the grid by the monitoring/control device.

The steps S40 and S50 will be described later.

The step S60 is for separating a section determined as a failure in the step S50 from the grid. More specifically, the failure section can be blocked by turning off the interruption means of the distributed power source or the distributed load which is determined that there is a failure.

The step S70 is a step of restarting the microgrid in a state where only the failure section is separated from the grid before the failure is completely recovered in the failure state, which may be referred to as a black start. If it is checked in the step S70 that the failure section of the grid is separated (S60), first, the ESS PCS is connected to the microgrid system to supply power to the non-failure section, and the PCS of the blocked distributed power sources (PV/WT) can be sequentially connected to the microgrid.

Figure 3:
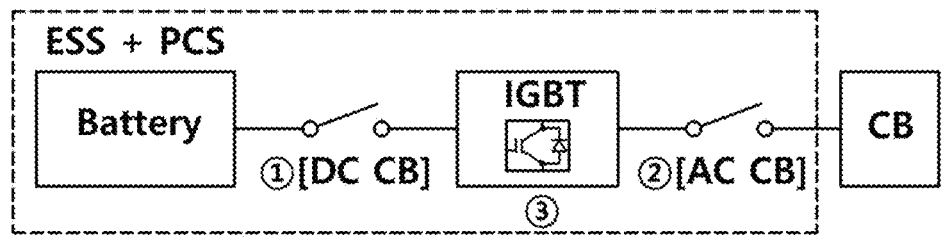
FIG. 3 is a block diagram illustrating a connection structure of an ESS PCS to a microgrid, which can be applied to perform steps S20 and S30 of FIG. 2.

FIG. 3 illustrates an embodiment of a connection structure of the ESS PCS to the microgrid, which can be applied to perform the steps S20 and S30.

As the illustrated connection structure of the ESS PCS to the microgrid, the interruption means may include a DC-stage switch DC CB for interrupting the battery of the ESS and the PCS inverter; an AC-stage switch AC CB for interrupting an inverter of the ESS PCS and the microgrid; and an IGBT interruption means (not illustrated) for interrupting the IGBT constituting the inverter.

As illustrated, the battery of the ESS is interrupted with the inverter by the DC-stage switch DC CB, and the inverter can be interrupted with the ESS interruption means (CB, 781 in FIG. 1) or the microgrid by the AC-stage switch AC CB again. The order in which the ESS PCS separated from the grid due to the failure occurring in the grid are connected to the grid again according to the present invention is that, first, the DC-stage switch DC CB is closed, next, the AC-stage switch (AC CB) is closed, and next, the IGBT constituting the inverter is closed according to the DC-AC conversion operation.

Table 1 below describes criteria of the failure position determination performed in the failure position determination step S50.

TABLE 1

| | |
|---|---|
| Failure in ESS | It is determined whether or not an ESS PCS operates (in case of a failure, the ESS PCS does not operate) |
| Failure or Temporary Failure in Installed Distributed Power Source | Off-grid voltage application is possible. (It is determined that there is no failure section in the voltage-applied grid) -> Distributed power sources are sequentially connected. (If there is a power failure due to the connected distributed power sources, it is determined that there is a failure due to the distributed power sources) |
| Failure in Line | In case of a line section where there is a failure, There is a difference in magnitude between currents before and after measurement The difference in magnitude between the currents before and after measurement is a current flowing in a failure point |

TABLE 1-continued

| | |
|---|---|
| Failure in Load Section | In case of other line sections, The magnitudes of the currents before and after measurement are almost the same A measured value at the end stage is compared with a setting value to determine a failure section Measured Value > Setting Value × 0.5 (variable) ex) If the rated capacity of the ESS is 1M, the multiplication factor can be set to 0.8 If the rated capacity of the ESS is 2M, the multiplication factor can be set to 0.7 |

The criteria described in the above table can be applied to a failure position determination method described later.

In the above table, in the phrase "currents before and after measurement having a difference in magnitude of the currents occurring in the failure section of the line" as a basis for determining whether or not there is a failure in line, "before/after" may denote the forward and backward points of the line position of each of measurement points of the line.

Figure 4:
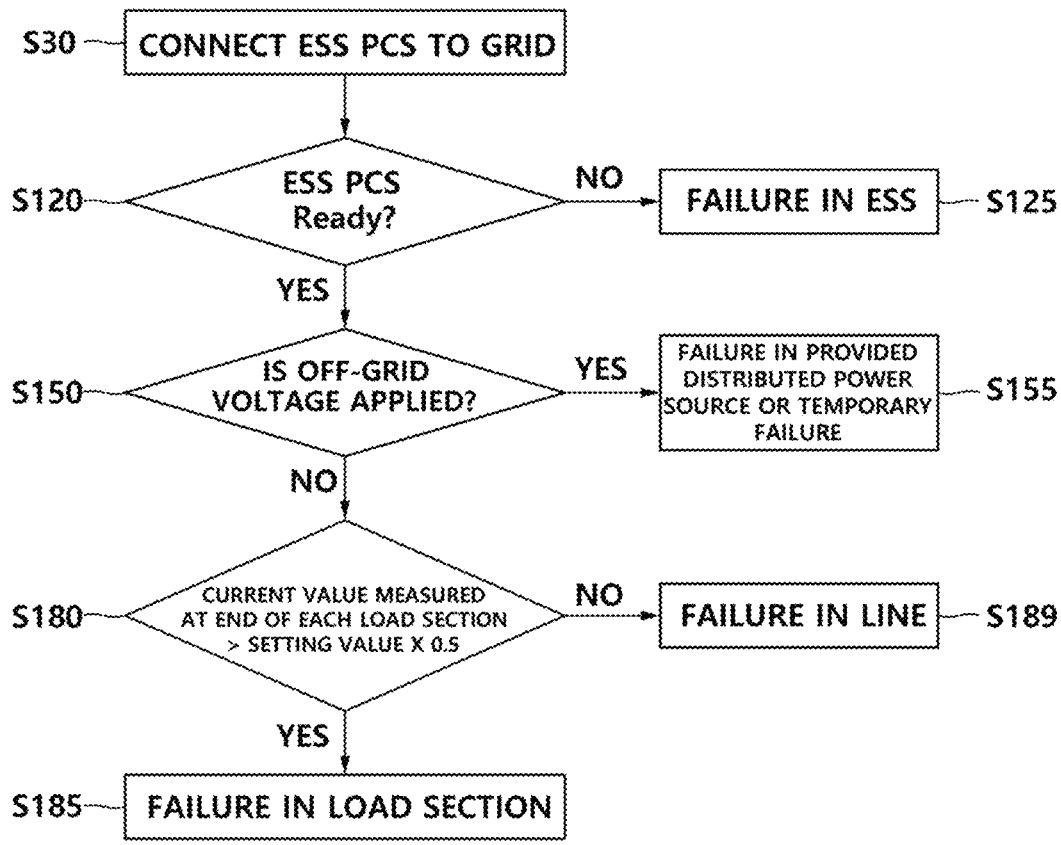
FIG. 4 is a flowchart illustrating an embodiment of a failure position determination method performed in the step S50 of FIG.

FIG. 4 is a flowchart illustrating an example of a failure position determination method performed in the failure position determination step S50.

The illustrated failure position determination method may include: a step S120 of checking whether or not the ESS PCS is in a normal operation when the ESS PCS is connected to the grid (S30); a step S150 of gradually increasing the voltage supplied to the grid in the ESS PCS, monitoring the current of the microgrid, and checking whether or not there a failure in a line/load side, if it is checked that the ESS PCS is in a normal operation; a step S180 of checking whether or not there is a failure in each of load sections if it is checked that there is a failure in the line/load side; and a step 189 of checking whether or not there is a failure in a line if it is not checked that there is a failure in each load section.

The flowchart illustrated in FIG. 2 is executed by performing the step S30 of connecting the ESS PCS to the microgrid in FIG. 2, and the step S30 in the figure denotes the step S30 in FIG. 2.

If the ESS PCS or the ESS does not operate normally in the step S120 of checking whether or not the PCS normally operates, it is determined that there is a failure in the ESS, and the procedure is ended. The checking whether or not the ESS PCS normally operates is a general technique in the ESS PCS, and thus, detailed description thereof is omitted.

According to the implementation, after checking the normal operation of the ESS PCS in the step S120, a step of checking whether or not power enough to perform gradual voltage application (off-grid voltage application) to the grid according to the present invention is stored in the ESS may be further included. This is due to the considerable power required for the gradual voltage application to the grid in order to check whether or not there is a failure in the entire grid.

In the step S150 of checking whether or not a failure occurs in the line/load side, the increasing the voltage/current to be supplied to the grid in the ESS PCS denotes performing the step S40 of FIG. 2.

Figure 5:
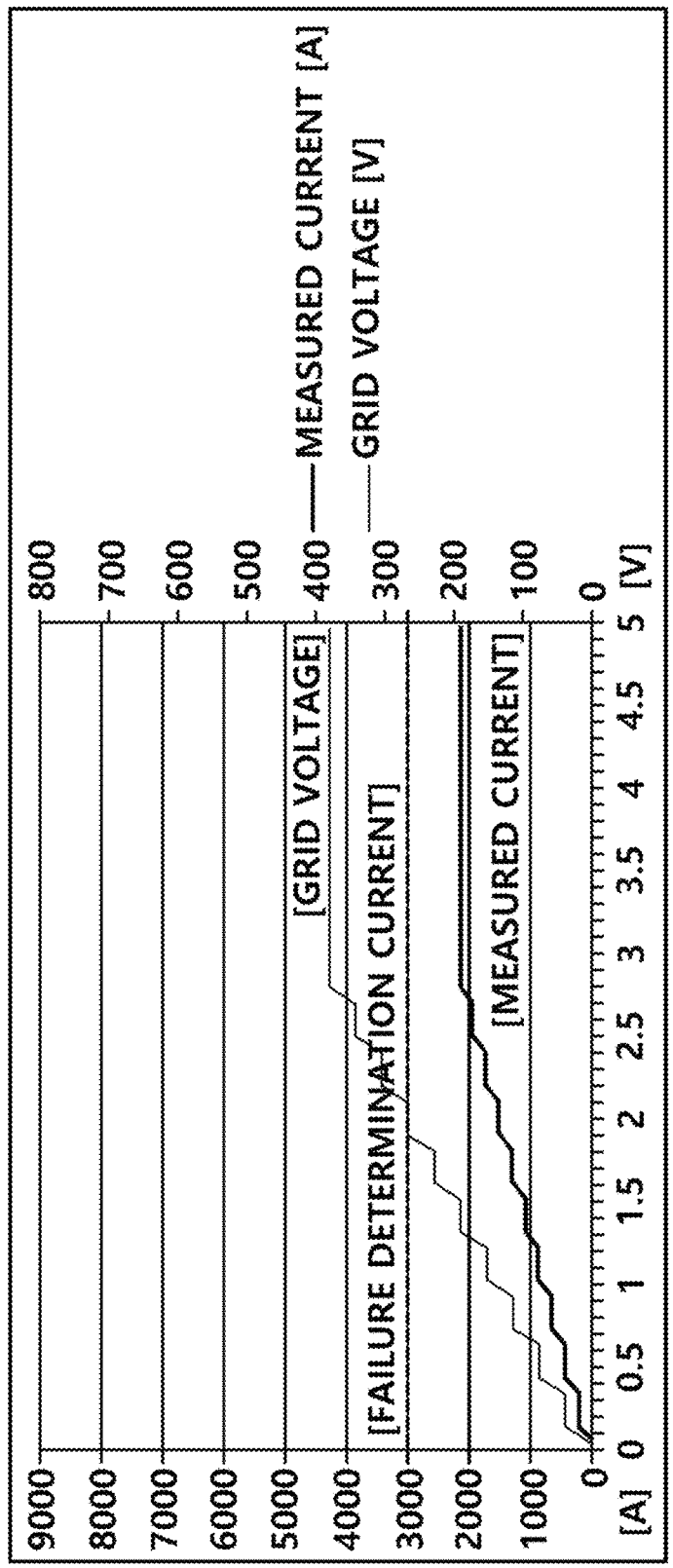
FIG. 5 is a graph illustrating voltages and currents measured for off-grid voltage application in a normal state.
Figure 6:
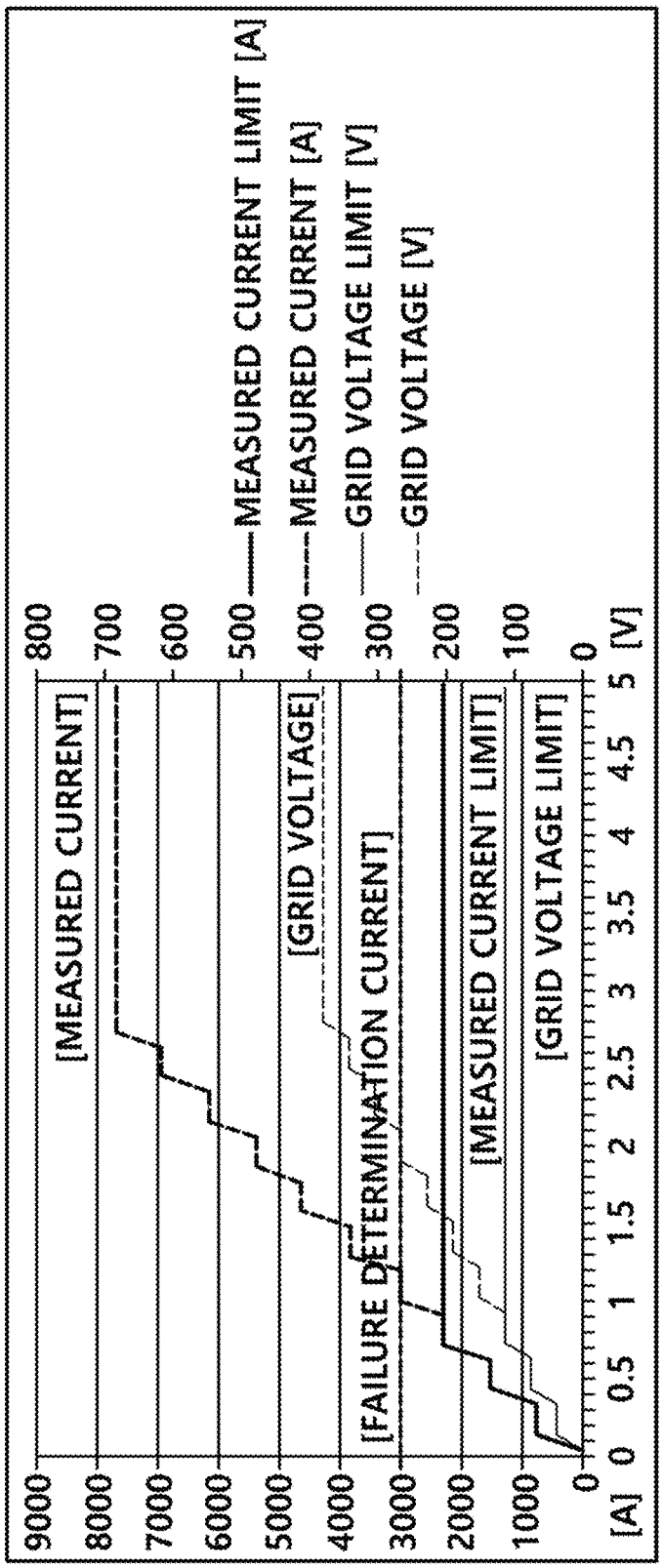
FIG. 6 is a graph illustrating voltages and currents measured for off-grid voltage application in a state where a failure occurs in a microgrid.

The operation of gradually increasing the voltage to be supplied to the grid in the ESS PCS performed in the step S150 can be referred to as off-grid voltage application. FIG. 5 is a graph illustrating a relationship between the voltage and the current measured for the off-grid voltage application in the normal state. FIG. 6 is a graph illustrating the voltage and the current measured for the off-grid voltage application in a state where there is a failure in the microgrid.

In the above two graphs, the grid voltage is 380 [V], the total load is 1.5 [M], and the ESS PCS capacity is 2.0 [M]. As a specific example of the failure, an event of single line-to-ground short circuit in the load 2 in FIG. 1 is assumed to occur.

In the voltage/current graph in the state where there is a failure illustrated in the figure, it can be seen that, when the voltage is raised to about 114 [V], the current reaches 80% (about 2.4 [kA]) of the failure determination current (rated current: about 3.0 [kA]). That is, if there is a failure in the microgrid system, the increase of the grid current due to the increase of the voltage supply is significantly larger than that in the case of the normal state (as a result, the current reaches 80% of the failure determination current at an earlier time). This is due to the occurrence of a leakage, a line-to-ground short circuit, or a short circuit in the load or the line, which results in lower load impedance of the grid than that of the normal case. In the method of checking whether or not there is a failure in the line/load side by using the phenomenon illustrated in the above two graphs, a trend of current change with the gradual increase of the voltage is compared with a trend of current change in the normal state, and if there is checked an increasing trend in which the current change is significantly higher than the trend of current change in the normal state, it is determined that there is a failure in the line/load side. Herein, the failure determination current is a reference current amount sufficient to determine a failure, and the failure determination current may be an amount of current that does not interfere with evenly distributing power to the line/load side connected to the grid. However, in general, the maximum current (rated current) that can be output to the grid to which the line/load side is connected in the ESS PCS is applicable.

In the step S30 in FIG. 2, since the distributed power source is not connected, it can be determined that the failure is not caused by the distributed power source.

If it is checked in the step S150 that the off-grid voltage application can be performed, it is determined that there is no failure section in the voltage-applied grid (the section connected to the grid in the step S30), and in the step S155, it can be checked whether or not the installed distributed power source can be sequentially connected and has a failure. For example, due to the connected distributed power source, if a power failure occurs again, it can be determined that there is a failure caused by the distributed power source. The fact that the off-grid voltage application can be performed denotes that the voltage-current pattern according to the graph illustrated in FIG. 5 appears.

If the off-grid voltage application is not properly performed in the step S150, operations after step S180 of measuring the magnitude and direction of the current of the line section and the load side are performed.

In the step S180, the current value measured at the end stage of each load section is compared with a predetermined setting value, and in a case where the current value falls below a predetermined ratio, it is determined that there is a failure in the load section. In other words, in the step S180, the current value measured at the end stage of each load section is compared with a setting value to determine the failure section. For example, if measured value>setting value×0.5 (variable), it can be determined that there is a failure in the corresponding section. However, in a case where the rated capacity of the ESS is 1M, 0.8 is applied as the multiplication factor of multiplication by the setting value, and in a case where the rated capacity of the ESS is 2M, 0.7 is applied as the multiplication factor. Like this, the multiplication factor can be adjusted according to the capacity or the like of the ESS.

In the step S189, in the case of a failure section of the line, by using the occurrence of a difference in magnitude between the currents before and after measurement, the difference in magnitude between the currents before and after measurement can be estimated as the current flowing in the failure point. In the case of a normal line section without the occurrence of a failure, the currents before and after measurement are similar.

Figure 7:
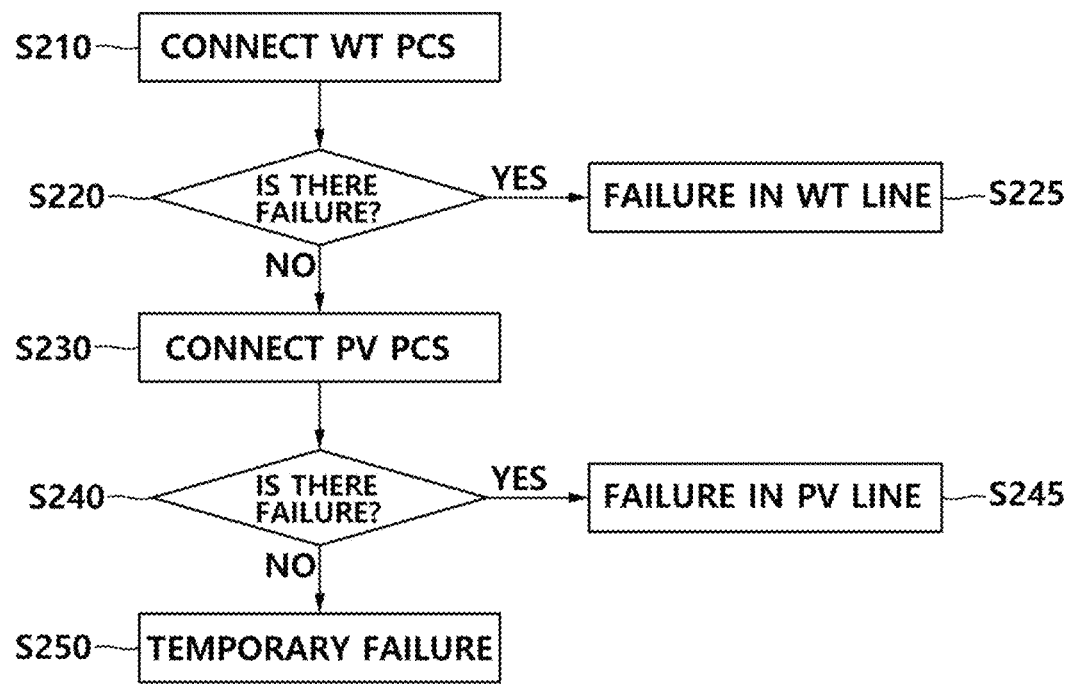
FIG. 7 is a flowchart illustrating a more specific process of sequentially connecting distributed power sources installed in the microgrid and checking whether or not there is a failure in the step S155 of FIG. 4.

FIG. 7 is a flowchart illustrating a more detailed process of sequentially connecting the distributed power sources installed in the microgrid and checking whether or not a failure has occurred in the step S155 of FIG. 4. FIG. 7 illustrates sequential connection of the installed distributed power sources for post-failure checking, and it is assumed that there are only a solar power source (PV) and a wind power source (WT) as the distributed power source separated from the microgrid due to the failure.

The illustrated distributed power source checking method may include: a step S210 of connecting the PCS of the wind power source WT to the grid; a step S220 of checking whether or not a power failure occurs; a step S230 of connecting the PCS of the solar power source (PV) to the grid if the power failure by the wind power source (WT) does not occur; a step S240 of checking whether or not a power failure occurs; and a step S250 of determining that there is a temporary failure if the power failure by the solar power source PV does not occur.

If it is checked in the step S220 that the power failure has occurred, it can be determined that there is a failure in the line of the wind power source WT (S225). If it is checked in the step S240 that the power failure has occurred, it can be determined that there is a failure in the line of the solar power PV (S245).

In the figure, first, the wind power source WT is checked, and then the PV power is checked. However, the checking order may be changed.

Figure 8:
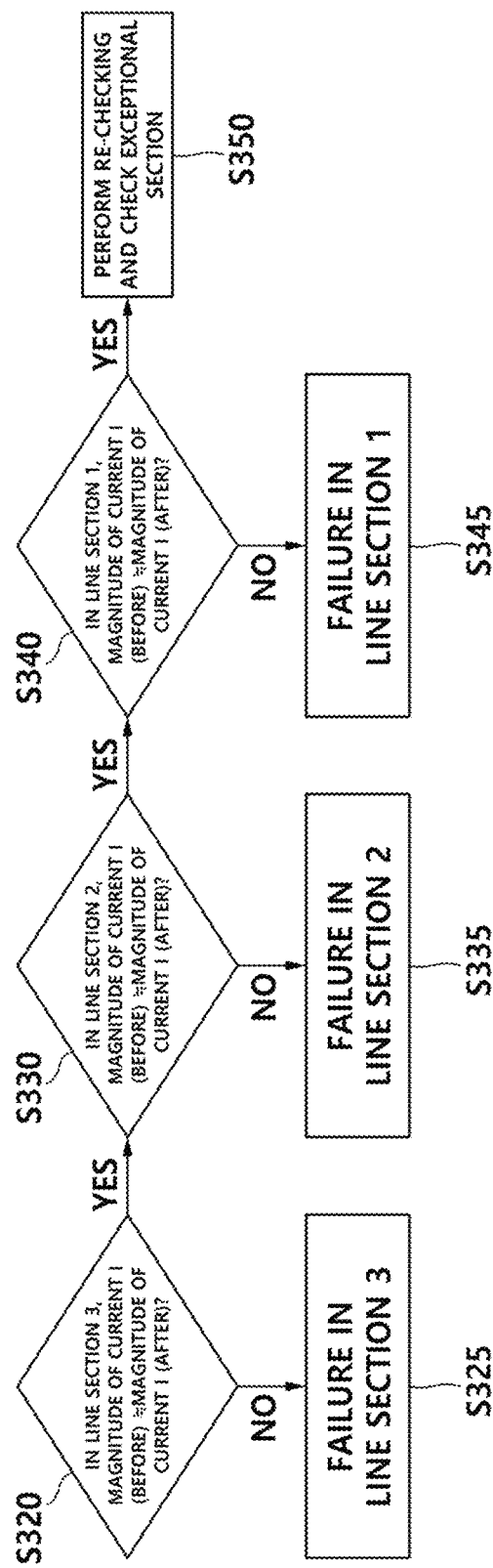
FIG. 8 is a flowchart illustrating a more specific process of checking whether or not there is a failure in line sections in the step S189 of FIG. 4.

FIG. 8 is a flowchart illustrating a more detailed process of checking whether or not there is a failure in the line sections in the step S189 of FIG. 4. In the figure, it is assumed that there are only line sections 1, 2, and 3.

The illustrated line section checking method may include: a step S320 of checking whether or not the magnitude of the current before measurement of the line section 3 is similar to the magnitude of the current after measurement (which denotes that the magnitudes of the currents belong to the same range in practical terms); a step S330 of checking whether or not the magnitude of the current before measurement of the line section 2 is similar to the magnitude of the current after measurement if the magnitudes of the currents before and after measurement of the line section 3 are similar to each other; a step S330 of checking whether or not the magnitude of the current before measurement of the line section 1 is similar to the magnitude of the current after measurement if the magnitudes of the currents before and after measurement of the line section 2 are similar to each other; and a step S350 of performing the re-checking and/or checking the exceptional section (excluded section) if the magnitudes of the currents before and after measurement of the line section 1 are similar to each other.

If it is checked in the step S320 that the magnitudes of the currents before and after measurement are different from each other, it can be determined that there is a failure in the line section 3 (S325). If it is checked in the step S330 that the magnitudes of the currents before and after measurement are different from each other, it can be determined that there is a failure in the line section 2 (S335). If it is checked in the step S340 that the magnitudes of the currents before and after measurement are different from each other, it can be determined that there is a failure in the line section 1 (S345).

As in the above Table 1, in the phrase "currents before and after measurement having a difference in magnitude of the currents occurring in the failure section of the line" as a basis for determining whether or not there is a failure in line, "before/after" may denote the forward and backward points of the line position of each of measurement points of the line.

In the figure, the line sections 3, 2, and 1 are checked in this order. The checking order is arbitrarily changed.

Figure 9A:
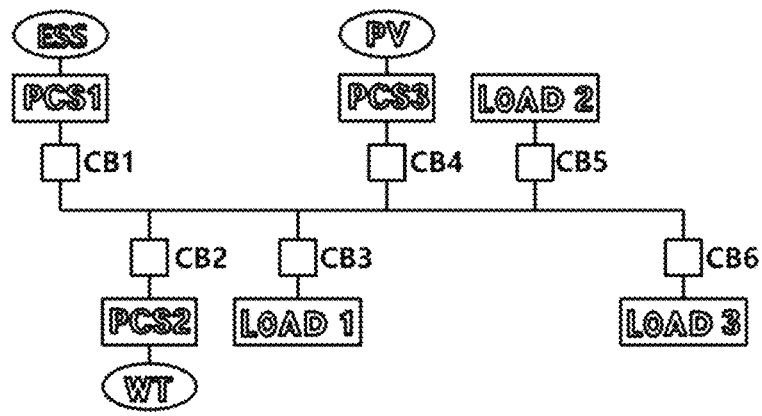
FIGS. 9(a) to 9(c) are block diagrams illustrating operations from the occurrence of a failure to a black start in a microgrid system according to the present invention.
Figure 9B:
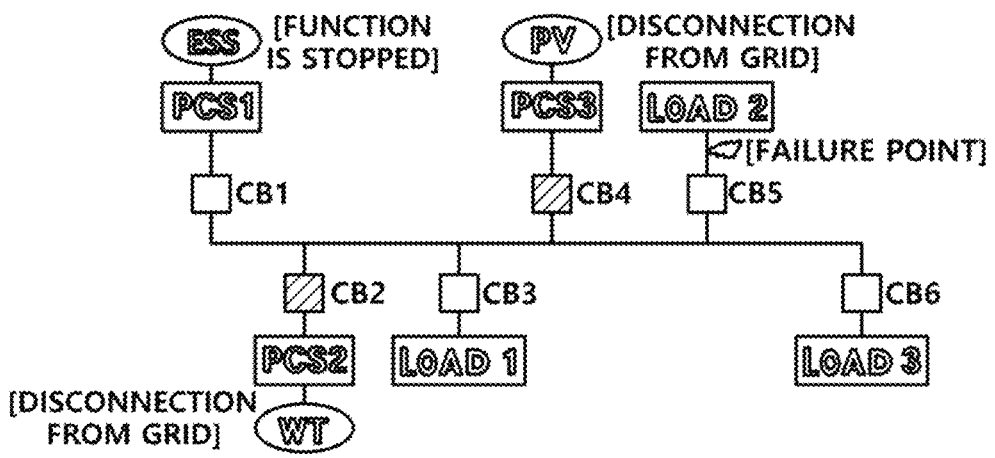
Figure 9C:
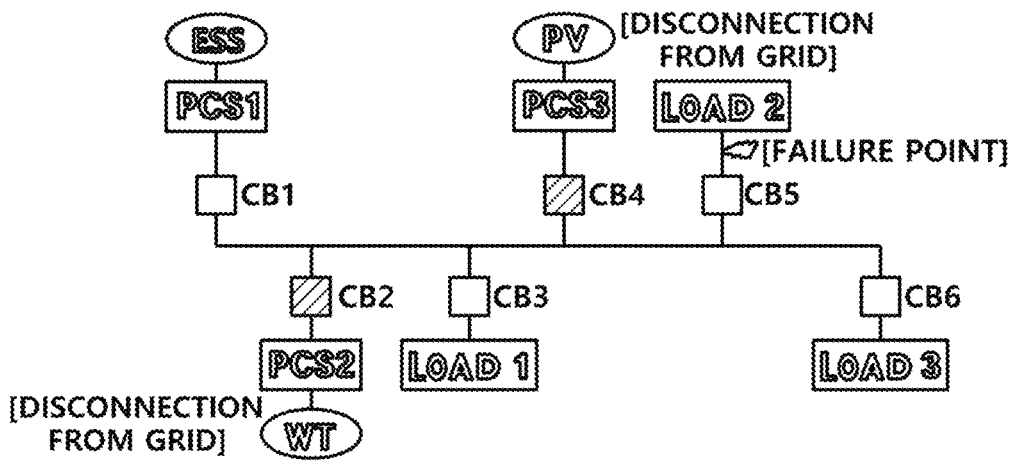

FIGS. 9(*a*) to 9(*c*) are block diagrams illustrating operations from the occurrence of a failure to a black start in the microgrid system according to the present invention.

As illustrated in FIG. 9(*a*), in the normal state, most of the interruption means of the microgrid are in the closed state, and the ESS is also connected to the microgrid by the closed interruption means irrespective of the operation.

If a dropout occurs in the load 2 in FIG. 9(*b*), the ESS including the PCS and each distributed power source (PV, WT) are blocked from the microgrid by the interruption means (CB: circuit breaker) and/or the PCS self protection function.

Next, in FIG. 9(*c*) illustrating a state in which the failure management according to the present invention is performed, the distributed power sources (PV, WT) are blocked from the grid as they are, the ESS PCS is connected to the microgrid, and by activating the ESS, the voltage of the grid is allowed to be gradually increased.

Figure 10:
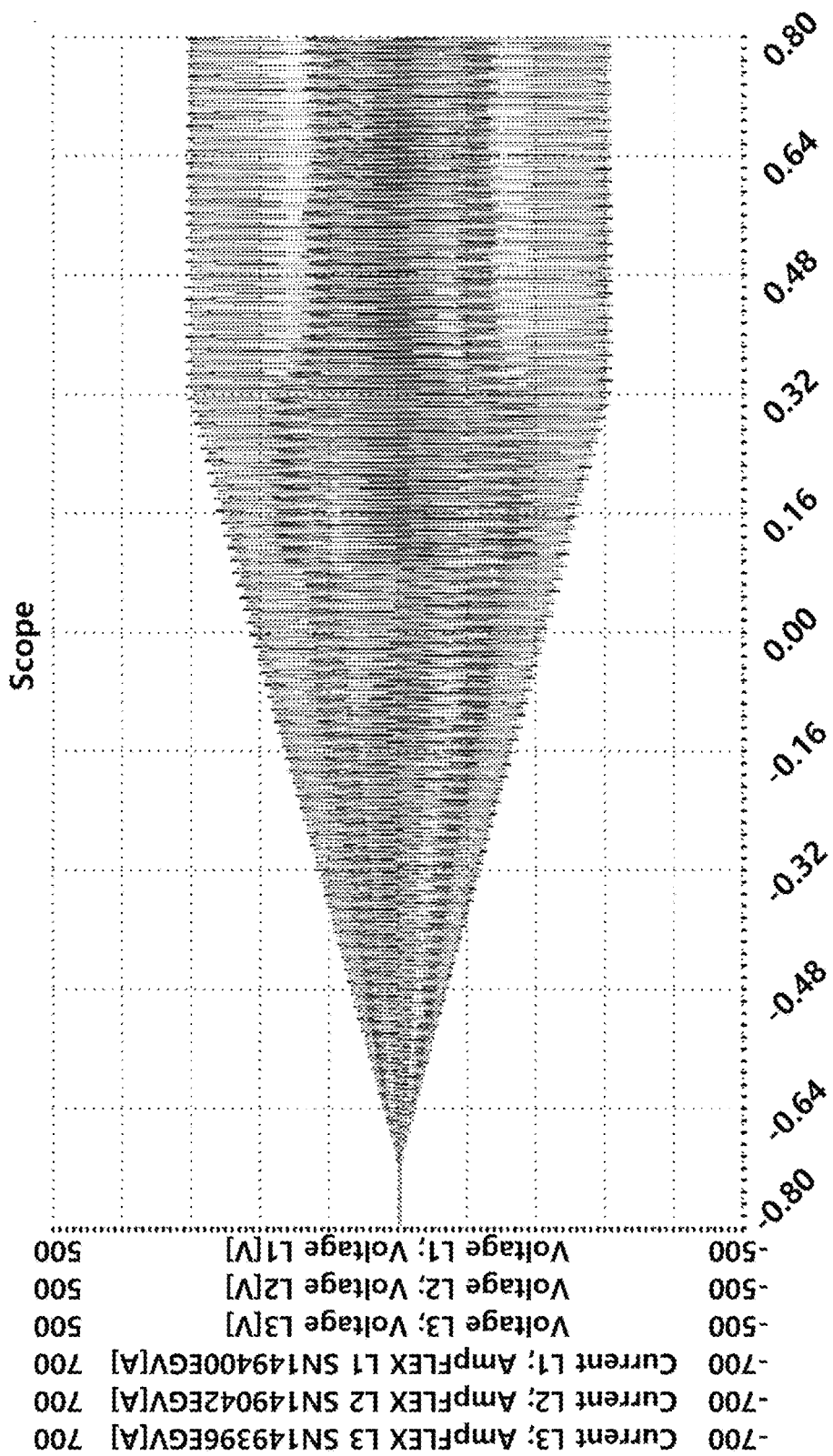
FIG. 10 is a graph illustrating voltage and current waveforms according to a gradual step-up start (soft start) of an ESS PCS according to the present invention.
Figure 11:
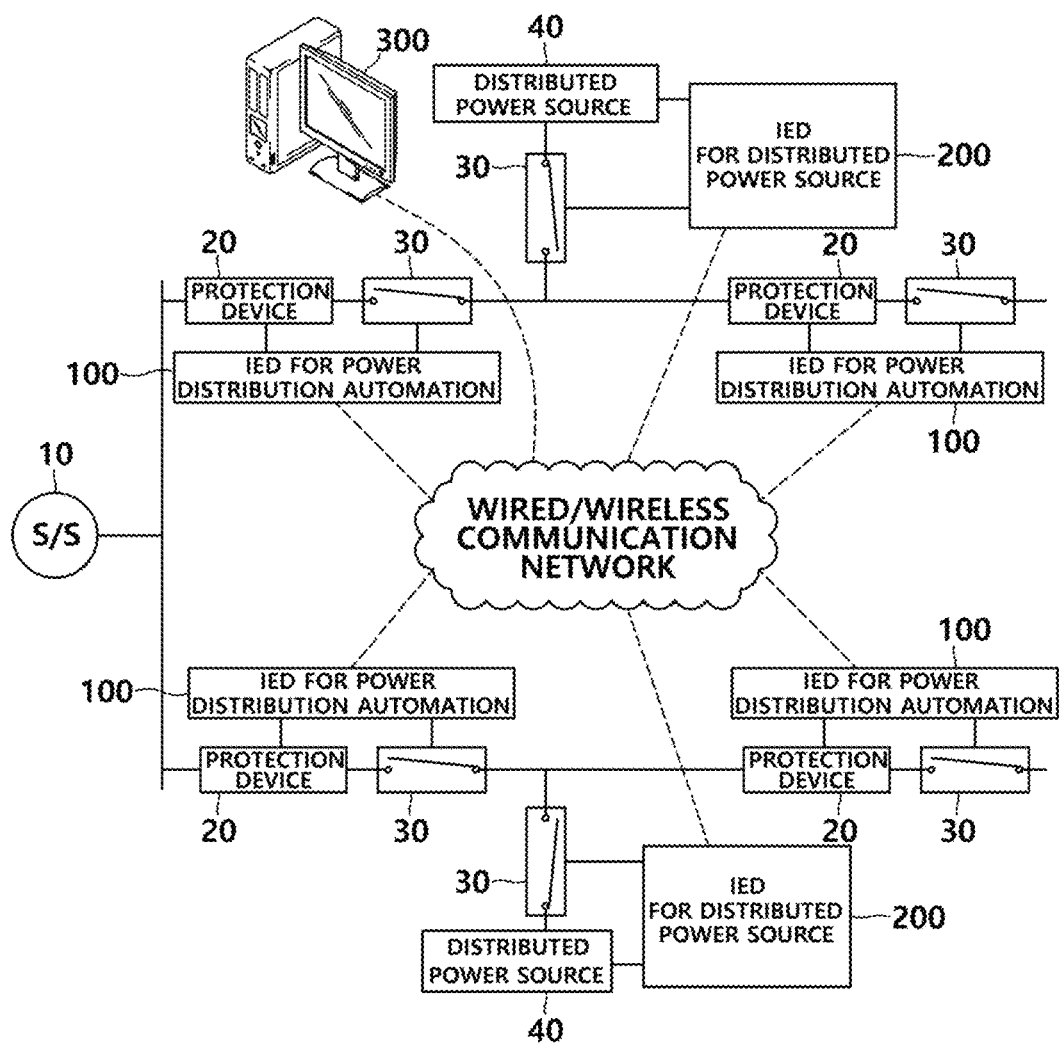
FIG. 11 is a block diagram illustrating a non-failure power source system in the related art, using a distributed power source.

FIG. 10 illustrates the voltage and current waveforms of the ESS PCS according to the gradual step-up start (soft Start) according to the present invention.

That is, the figure illustrates, as the soft start function of the PCS for battery, the voltage and current waveforms of the ESS output stage as the gradual increase of the output voltage from 0 V to the rated voltage for about 1 second.

The soft start operation of the ESS PCS described above can be connected to the black start, which blocks the failure portion in the grid and activates the microgrid again. As a grid condition for the black start, functions of a VCB-side UVR relay are required to deactivated during the black start, and after the deactivation of the UVR relay, by operating all the circuit breakers, the ESS PCS is required to be activated.

It should be noted that the above-described embodiments are for the purpose of description and are not intended for limitation thereof. In addition, it will be understood by the ordinarily skilled in the art that various embodiments are possible within the scope of the technical idea of the present invention.

REFERENCE NUMERALS

700: microgrid system
740, 750: distributed power source
771, 772, 773: distributed load
720: ESS
781 to 788: interruption means
781 to 785: detection/measurement means

INDUSTRIAL APPLICABILITY

The present invention relating to a microgrid system for performing failure management and a failure management method using the microgrid system can be used in a power system field.

The invention claimed is:

1. A microgrid system having:
a plurality of distributed power sources;
a plurality of distributed loads; and
lines for connecting the distributed power sources and the distributed loads,
the microgrid system comprising:
an ESS for storing power supplied from all or a portion of the distributed power sources and supplying the stored power to all or a portion of the distributed loads;
an ESS PCS including an interruption means for converting the power stored in the ESS into AC power suitable for a microgrid and supplying the AC power to the microgrid in order to block connection to the microgrid in an abnormal state; and
a monitoring/control device for gradually increasing a voltage output from the ESS PCS and performing processing for a failure when the failure is detected in the microgrid,
wherein the monitoring/control device performs the steps of:
blocking the distributed power sources and the ESS when the failure is detected in the microgrid;
connecting the ESS PCS to the microgrid;
gradually increasing the voltage output from the connected ESS PCS and determining a position where the failure occurred; and
blocking the position where the failure occurred and connecting the distributed power sources to the microgrid.

2. The microgrid system according to claim 1, wherein the interruption means includes:
a DC-stage switch for interrupting a battery and an inverter of the ESS;
an AC-stage switch for interrupting the inverter of the ESS PCS and the microgrid; and
an IGBT interruption means for interrupting an IGBT constituting the inverter.

3. The microgrid system according to claim 1,
wherein an open time of an IGBT including an inverter of the ESS PCS is within 400 [μs], and
wherein a time for gradually increasing the voltage output from the ESS PCS is a period of time specified in a range of 1 second to 3 seconds.

4. The microgrid system according to claim 1, wherein the monitoring/control device includes a communication means capable of communicating data with a detection/measurement means installed in the distributed power sources, the distributed loads, and the lines.

5. The microgrid system according to claim 1, wherein the monitoring/control device gradually increases current from 0 [A] to a level of 80% of a rated current that can be output to the microgrid for a specified period of time in order to gradually increase the voltage output from the ESS PCS.

6. A failure management method for a microgrid system having:
a plurality of distributed power sources;
a plurality of distributed loads;
lines for connecting the distributed power sources and the distributed loads; and
an ESS for storing power supplied from all or a portion of the distributed power sources and supplying the stored power to all or a portion of the distributed loads, the failure management method comprising the steps of:
blocking the distributed power sources and the ESS when a failure is detected in the microgrid system;
connecting a PCS of the ESS to a microgrid;

gradually increasing a voltage output in the PCS of the ESS and determining a position where the failure occurred; and blocking the position where the failure occurred and connecting the distributed power source to the microgrid.

7. The failure management method according to claim 6, wherein the step of connecting the PCS of the ESS to the microgrid includes the steps of:

closing a DC-stage switch for interrupting a battery and an inverter of the ESS;

closing an AC-stage switch for interrupting the inverter of the ESS and the microgrid; and closing an IGBT including the inverter.

8. The failure management method according to claim 6, wherein, in the step of determining the position where the failure has occurred, a trend of current change with the gradual increase of the voltage is compared with the trend of current change in a normal state, and if an increasing trend in which the trend of current change is significantly higher than the trend of current change in the normal state is checked, it is determined that the failure has occurred in a line/load side.

9. The failure management method according to claim 6, wherein, in the step of determining the position where the failure has occurred, current is gradually increased from 0 [A] to a level of 80% of a rated current that can be output to the microgrid for a specified period of time in order to gradually increase the voltage output from the ESS PCS.

\* \* \* \* \*